United States Patent
Lu et al.

(10) Patent No.: US 11,271,014 B2
(45) Date of Patent: Mar. 8, 2022

(54) PHOTOSENSITIVE DEVICE, THIN FILM TRANSISTOR ARRAY SUBSTRATE, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Macai Lu, Shenzhen (CN); Nian Liu, Shenzhen (CN)

(*) Notice: Subject to any disclaimer, the term of this patent is extended or adjusted under 35 U.S.C. 154(b) by 200 days.

(21) Appl. No.: 16/618,370

(22) PCT Filed: May 14, 2019

(86) PCT No.: PCT/CN2019/086736
§ 371 (c)(1),
(2) Date: Dec. 1, 2019

(87) PCT Pub. No.: WO2020/206801
PCT Pub. Date: Oct. 15, 2020

(65) Prior Publication Data
US 2021/0335836 A1    Oct. 28, 2021

(30) Foreign Application Priority Data
Apr. 11, 2019   (CN) .......................... 201910287732.6

(51) Int. Cl.
*H01L 27/00*    (2006.01)
*H01L 27/12*    (2006.01)

(52) U.S. Cl.
CPC ...... *H01L 27/1225* (2013.01); *H01L 27/1251* (2013.01)

(58) Field of Classification Search
CPC ............. H01L 27/1225; H01L 27/1251; H01L 27/3262; H01L 27/3248; H01L 27/1222;
(Continued)

(56) References Cited

U.S. PATENT DOCUMENTS 8,300,031 B2 * 10/2012 Kimura ................ G09G 3/3233
345/204
8,896,224 B2 * 11/2014 Kuo ....................... H05B 33/08
315/210
(Continued)

FOREIGN PATENT DOCUMENTS

CN    1607561 A    4/2005
CN    1699936 A    11/2005
(Continued)

*Primary Examiner* — Nikolay K Yushin

(57) ABSTRACT

A photosensitive device comprising a first oxide thin film transistor and a second oxide thin film transistor. Wherein, a drain of the first oxide thin film transistor is electrically connected to a gate of the second oxide thin film transistor. The photosensitive device according to the present application adopts oxide thin film transistors arranged in a plurality of layers, which greatly improves the response amplitude to ambient light and breaks through the limitations of the single thin film transistor's low light response which makes it impossible to be used as a visible light detecting component. Therefore, the photosensitive device according to the present application can realize detection of ambient light and can expand the scope in which it can be applied.

5 Claims, 3 Drawing Sheets

(58) Field of Classification Search
CPC ............. H01L 27/1248; H01L 27/1214; G02F
1/133711; G02F 1/1333; G02F 1/13338
See application file for complete search history.

(56) References Cited

U.S. PATENT DOCUMENTS

| | | | |
|---|---|---|---|
| 9,190,437 B2 * | 11/2015 | Kawanabe | ........ H01L 27/14665 |
| 2002/0185589 A1 | 12/2002 | Cazaux | |
| 2005/0258341 A1 | 11/2005 | Nishikawa et al. | |
| 2006/0238135 A1 * | 10/2006 | Kimura | .................... G09G 3/20 |
| | | | 315/169.3 |
| 2007/0171157 A1 | 7/2007 | Choi et al. | |
| 2008/0245948 A1 | 10/2008 | Tsai | |
| 2013/0099093 A1 * | 4/2013 | Kawanabe | ........ H01L 27/14609 |
| | | | 250/208.1 |
| 2014/0312801 A1 * | 10/2014 | Kuo | ....................... H05B 33/08 |
| | | | 315/291 |

FOREIGN PATENT DOCUMENTS

| | | |
|---|---|---|
| CN | 201048131 Y | 4/2008 |
| CN | 101281916 A | 10/2008 |

* cited by examiner

PHOTOSENSITIVE DEVICE, THIN FILM TRANSISTOR ARRAY SUBSTRATE, AND DISPLAY PANEL

CROSS REFERENCE TO RELATED APPLICATION

This application claims the priority of International Application No. PCT/CN2019/086736, filed on 2019 May 14, which claims priority to Chinese Application No. 201910287732.6, filed on 2019 Apr. 11. The entire disclosures of each of the above applications are incorporated herein by reference.

BACKGROUND OF APPLICATION

Field of Invention

The present application relates to the field of display technologies, and in particular, to a photosensitive device, a thin film transistor (TFT) array substrate, and a display panel.

Description of Prior Art

With development of display technology, thin film transistor liquid crystal displays (TFT-LCDs) have dominated the display field with their absolute advantages (low cost, good display quality, low power consumption, etc) and are applied to audio-visual equipment such as computers, televisions, and mobile phones.

Liquid crystal panels usually include a color filter substrate (CF), a thin film transistor array substrate (TFT array substrate), and a liquid crystal layer disposed between the two substrates. A working principle of the liquid crystal panel is to control rotation of the liquid crystal molecules of the liquid crystal layer by applying a driving voltage on the two glass substrates and refract light of a backlight module to generate a picture. Thin film transistors in the TFT substrate play a direct role in realizing normal display function.

Further, with continuous development of technology, the industry has developed metal oxide thin film transistors, which are used in the next generation display device due to their high mobility, transparency, low subthreshold swing and the like.

However, a single metal oxide thin film transistor, such as an indium gallium zinc oxide (IGZO) TFT, has a poor optical response to visible light due to its big band gap, thereby it is difficult to perform optical detection on a display substrate. As shown in FIG. 4, influences of an illumination condition and a non-illumination condition on an Id-Vg characteristics of the metal oxide thin film transistor is shown.

Obviously, as shown in FIG. 4, an optical array detection capability of the TFT array substrate is weak, thereby it is not suitable for applications used for fingerprint recognition and ambient light detection in the display screen, and it is not conducive to its application as a next-generation display device.

Therefore, it is necessary to develop a new type of photosensitive device to overcome the drawbacks of the prior art.

SUMMARY OF APPLICATION

One aspect of the present application is to provide a photosensitive device that adopts a novel oxide thin film transistor, which effectively enhances its overall response to ambient light and expands its application scope.

The technical solution adopted by the present application is as follows:

A photosensitive device comprising a first oxide thin film transistor and a second oxide thin film transistor; wherein, a drain of the first oxide thin film transistor is electrically connected to a gate of the second oxide thin film transistor. The photosensitive device according to the present application adopts oxide thin film transistors arranged in a plurality of layers, which greatly improves the response amplitude to ambient light and breaks through the limitations of the single thin film transistor's low light response which makes it impossible to be used as a visible light detecting component. Therefore, the photosensitive device according to the present application can realize detection of ambient light and can expand the scope in which it can be applied.

Further, in different embodiments, wherein the first oxide thin film transistor comprises one of a top gate type indium gallium zinc oxide (IGZO) thin film transistor (TFT), a top gate type indium gallium zinc tin oxide (IGZTO) TFT, or a back channel etched (BCE) type IGZO TFT.

Further, in different embodiments, wherein the second oxide thin film transistor comprises one of a top gate type indium gallium zinc oxide (IGZO) thin film transistor (TFT), a top gate type indium gallium zinc tin oxide (IGZTO) TFT, or a back channel etched (BCE) type IGZO TFT.

Further, in different embodiments, the photosensitive device further comprising a third oxide thin film transistor, wherein a drain of the second oxide thin film transistor is electrically connected to a gate of the third oxide thin film transistor.

Further, in different embodiments, wherein the third oxide thin film transistor comprises one of a top gate type indium gallium zinc oxide (IGZO) thin film transistor (TFT), a top gate type indium gallium zinc tin oxide (IGZTO) TFT, or a back channel etched (BCE) type IGZO TFT.

Further, in different embodiments, wherein the first oxide thin film transistor, the second oxide thin film transistor, and the third oxide thin film transistor are the same type of oxide thin film transistor.

Further, another aspect of the present application provides a thin film transistor (TFT) array substrate comprising a substrate layer, wherein the substrate layer is provided with the photosensitive device of claim 1.

Further, in different embodiments, wherein the substrate layer is further provided with a detecting circuit and a signal reading circuit;

wherein an output end of the detecting circuit is connected to a gate of the first oxide thin film transistor and inputs a voltage to the gate of the first oxide thin film transistor, and the signal reading circuit is connected to a drain of the second oxide thin film transistor and reads a current signal of the second oxide thin film transistor. Wherein the detecting circuit inputs a predetermined voltage to a gate of the first oxide thin film transistor, the signal reading circuit reads a corresponding output current signal of a drain of the second oxide thin film transistor, and then compares it with preset photoelectric data. The light intensity received by the photosensitive device can be obtained based on the read current signal.

Further, in different embodiments, wherein a predetermined value of the voltage input to the gate of the first oxide thin film transistor ranges from −25V to −10V.

Further, another aspect of the present application provides a display panel, the display panel comprising the TFT array substrate described above.

Compared with the prior art, the present application provides a photosensitive device, a TFT array substrate and a display panel. The photosensitive device according to the present application adopts oxide thin film transistors arranged in a plurality of layers, which greatly improves the response amplitude to ambient light and breaks through the limitations of the single thin film transistor's low light response which makes it impossible to be used as a visible light detecting component. Therefore, the photosensitive device according to the present application can realize detection of ambient light and can expand the scope in which it can be applied.

For example, the TFT array substrate and the display panel can realize fingerprint recognition function under screen or detection function of the ambient light, so that the oxide thin film transistors meet the requirements of the industry for the use of the next generation display device.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

The technical solutions of a photosensitive device, a thin film transistor (TFT) substrate and a display panel thereof according to the present application will be further described in detail below with reference to the accompanying drawings and embodiments.

Figure 1:
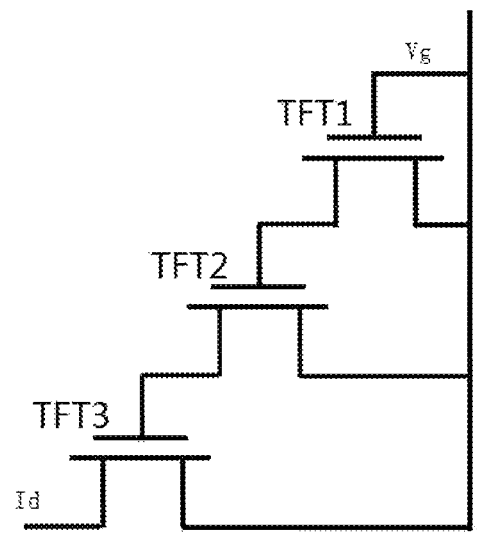
FIG. 1 is a schematic structural diagram of a photosensitive device provided in an embodiment of the present application.

Referring to FIG. 1, the present application provides a photosensitive device including a first oxide thin film transistor TFT1, a second oxide thin film transistor TFT2, and a third oxide thin film transistor TFT3.

As shown in FIG. 1, a drain of the first oxide thin film transistor TFT1 is electrically connected to a gate of the second oxide thin film transistor TFT2. A drain of the second oxide thin film transistor TFT2 is electrically connected to a gate of the third oxide thin film transistor TFT3.

The photosensitive device according to the present application adopts oxide thin film transistors arranged in a plurality of layers, which greatly improves the response amplitude to ambient light and breaks through the limitations of the single thin film transistor's low light response which makes it impossible to be used as a visible light detecting component. Therefore, the photosensitive device according to the present application can realize detection of ambient light and can expand the scope in which it can be applied.

Further, in various embodiments, the first oxide thin film transistor, the second oxide thin film transistor and the third oxide thin film transistor are preferably the same type of oxide thin film transistor, such as one of a top gate type indium gallium zinc oxide (IGZO) TFT, a top gate type indium gallium zinc tin oxide (IGZTO) TFT, or a back channel etched (BCE) type IGZO TFT.

Further, the photosensitive device of the present application is not limited to a three-stage TFT structure. In different embodiments, it can be a secondary TFT structure, or a four-stage TFT structure or more, and can be specifically set as needed.

Further, another embodiment of the present application provides a thin film transistor array substrate including a substrate layer, wherein the substrate layer is provided with the photosensitive device.

Figure 2:
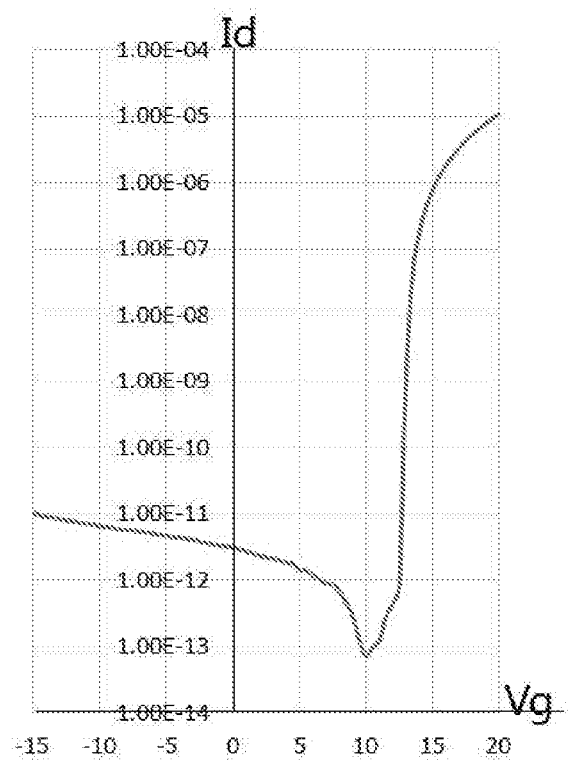
FIG. 2 is a relationship between a gate voltage Vg of the first oxide thin film transistor and a drain current Id of the third oxide thin film transistor of the photosensitive device of FIG. 1 under a non-illumination condition.
Figure 3:
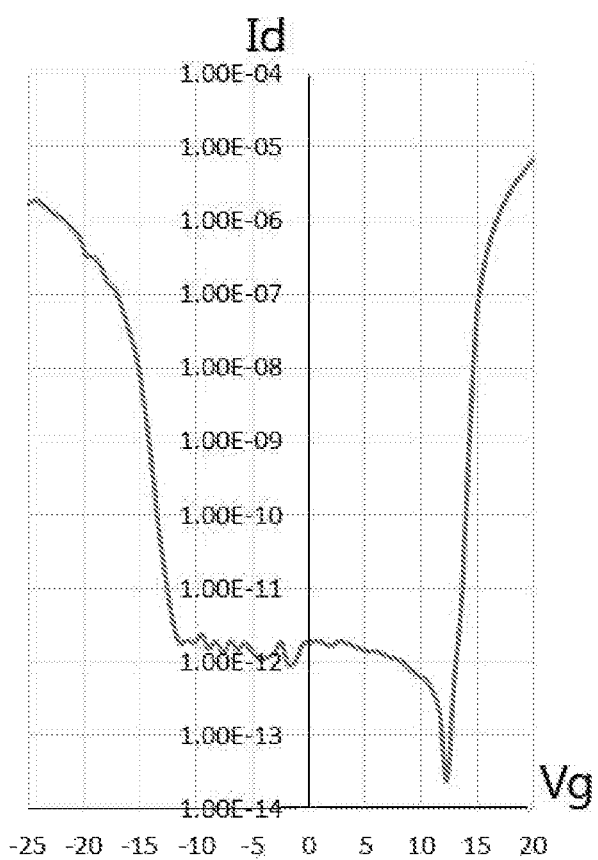
FIG. 3 is a relationship between a gate voltage Vg of the first oxide thin film transistor and a drain current Id of the third oxide thin film transistor of the photosensitive device of FIG. 1 under an illumination condition.
Figure 4:
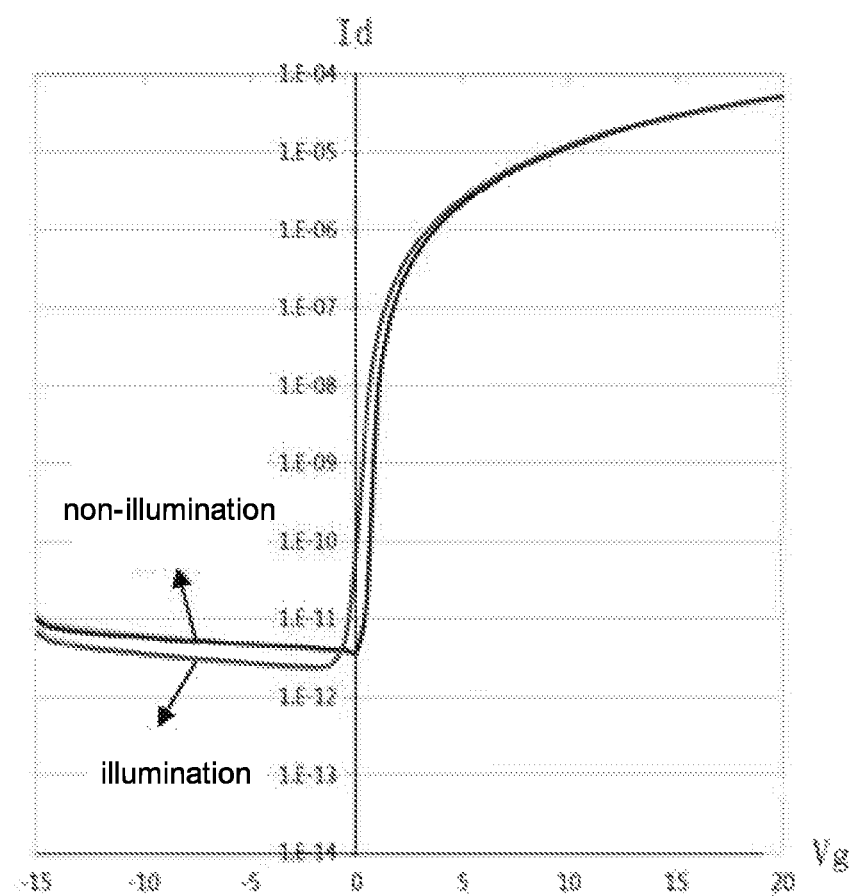
FIG. 4 is an Id-Vg characteristic of an oxide thin film transistor according to the prior art under an unilluminated condition and a non-illumination condition.

The substrate layer is further provided with a detecting circuit and a signal reading circuit. Wherein an output end of the detecting circuit is connected to a gate of the first oxide thin film transistor and inputs a voltage to the gate of the first oxide thin film transistor, and the signal reading circuit is connected to a drain of the second oxide thin film transistor and reads a current signal of the second oxide thin film transistor.

Wherein the detecting circuit inputs a predetermined voltage (Vg) to a gate of the first oxide thin film transistor, the signal reading circuit reads a corresponding output current signal (Id) of a drain of the second oxide thin film transistor, and then compares it with preset photoelectric data. The light intensity received by the photosensitive device can be obtained based on the read current signal.

Wherein a preferred predetermined value of the voltage input to the gate of the first oxide thin film transistor ranges from −25V to −10V, but not limit to it. Further, referring to FIG. 2 and FIG. 3, which illustrate the relationship between the drain current signal and the gate voltage (Id-Vg) under an illumination condition and a non-illumination condition.

Further, another aspect of the present application provides a display panel, the display panel comprising the TFT array substrate described above.

The present application provides a photosensitive device, a TFT array substrate and a display panel. The photosensitive device according to the present application adopts oxide thin film transistors arranged in a plurality of layers, which greatly improves the response amplitude to ambient light and breaks through the limitations of the single thin film transistor's low light response which makes it impossible to be used as a visible light detecting component. Therefore, the photosensitive device according to the present application can realize detection of ambient light and can expand the scope in which it can be applied.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A photosensitive device, comprising: a first indium gallium zinc oxide thin film transistor, a second indium gallium zinc oxide thin film transistor, and a third indium gallium zinc oxide thin film transistor;

wherein a drain of the first indium gallium zinc oxide thin film transistor is electrically connected to a gate of the second indium gallium zinc oxide thin film transistor, and a drain of the second indium gallium zinc oxide thin film transistor is electrically connected to a gate of the third indium gallium zinc oxide thin film transistor.

2. The photosensitive device according to claim 1, wherein the first indium gallium zinc oxide thin film transistor comprises one of a top gate type indium gallium zinc oxide (IGZO) thin film transistor (TFT), or a back channel etched (BCE) type IGZO TFT.

3. The photosensitive device according to claim 1, wherein the second indium gallium zinc oxide thin film transistor comprises one of a top gate type indium gallium zinc oxide (IGZO) thin film transistor (TFT), or a back channel etched (BCE) type IGZO TFT.

4. The photosensitive device according to claim 1, wherein the third indium gallium zinc oxide thin film transistor comprises one of a top gate type indium gallium zinc oxide (IGZO) thin film transistor (TFT), or a back channel etched (BCE) type IGZO TFT.

5. The photosensitive device according to claim 4, wherein the first indium gallium zinc oxide thin film transistor, the second indium gallium zinc oxide thin film transistor, and the third indium gallium zinc oxide thin film transistor are the same type of oxide thin film transistor.

\* \* \* \* \*